United States Patent
Kwak et al.

(10) Patent No.: US 10,811,452 B2
(45) Date of Patent: Oct. 20, 2020

(54) IMAGE SENSING DEVICE INCLUDING NOISE BLOCKING STRUCTURE

(71) Applicant: SK hynix Inc., Icheon-si (KR)

(72) Inventors: Ho Young Kwak, Cheongju-si (KR); Jong Eun Kim, Deajeon (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/460,908

(22) Filed: Jul. 2, 2019

(65) Prior Publication Data

US 2020/0194481 A1   Jun. 18, 2020

(30) Foreign Application Priority Data

Dec. 12, 2018 (KR) .......................... 10-2018-0159794

(51) Int. Cl.
  *H01L 27/146* (2006.01)
  *H04N 5/378* (2011.01)

(52) U.S. Cl.
  CPC .. *H01L 27/14623* (2013.01); *H01L 27/14636* (2013.01); *H01L 27/14685* (2013.01); *H04N 5/378* (2013.01)

(58) Field of Classification Search
  CPC ......... H01L 27/14623; H01L 27/14636; H01L 27/14685; H01L 27/0248; H01L 27/0924; H01L 27/0922; H01L 27/22; H04N 5/378
  See application file for complete search history.

(56) References Cited

U.S. PATENT DOCUMENTS

| | | | |
|---|---|---|---|
| 6,657,242 B1 * | 12/2003 | Norstrom .......... | H01L 21/76224 257/197 |
| 9,666,630 B2 | 5/2017 | Chuang et al. | |
| 10,483,153 B2 * | 11/2019 | Yen ................... | H01L 21/30604 |
| 2006/0010885 A1 | 1/2006 | Van Berkel | |
| 2013/0288419 A1 | 10/2013 | Akiyama et al. | |
| 2018/0182747 A1 * | 6/2018 | Kim ..................... | H01L 21/761 |
| 2020/0066768 A1 * | 2/2020 | Cheng ............... | H01L 27/14636 |

* cited by examiner

*Primary Examiner* — Luong T Nguyen
(74) *Attorney, Agent, or Firm* — Perkins Coie LLP (57) ABSTRACT

An image sensing device including a noise blocking structure is disclosed. The image sensing device includes a semiconductor substrate structured to support a plurality of image pixels producing signals upon a detection of an incident light and a logic circuit configured to process signals produced by the image pixels are formed, and a noise blocking structure disposed at the semiconductor substrate and formed to surround the logic circuit is formed. The noise blocking structure includes a first blocking structure and a second blocking structure. The first blocking structure includes multiple portions spaced from one another, each of the multiple portions extending in a line without any bending portion. The second blocking structure are disposed between the multiple portions of the first blocking structure and include portions partially overlapping with the first blocking structure.

23 Claims, 9 Drawing Sheets

IMAGE SENSING DEVICE INCLUDING NOISE BLOCKING STRUCTURE

CROSS-REFERENCE TO RELATED APPLICATION

This patent document claims priority to and benefits of Korean patent application No. 10-2018-0159794, filed on Dec. 12, 2018, which is incorporated herein by reference in its entirety.

TECHNICAL FIELD

The technology and implementations disclosed in this patent document relate to an image sensing device.

BACKGROUND

An image sensing device is a device for capturing at least one image using semiconductor characteristics that react to light. In recent times, with the increasing development of computer industries and communication industries, demand for high-quality and high-performance image sensors is rapidly increasing in various fields, for example, digital cameras, camcorders, personal communication systems (PCSs), game consoles, surveillance cameras, medical micro-cameras, robots, etc.

Image sensing devices may be broadly classified into CCD (Charge Coupled Device)-based image sensing devices and CMOS(Complementary Metal Oxide Semiconductor)-based image sensing devices. Recently, since an analog control circuit and a digital control circuit can be directly implemented as a single integrated circuit (IC), CMOS-based image sensing devices have rapidly come into widespread use.

SUMMARY

Various embodiments of the disclosed technology are directed to an image sensing device including a noise blocking structure. Some implementations of the disclosed technology relate to an image sensing device capable of efficiently preventing noise generated from a logic circuit block embedded therein from leaking outside the logic circuit block and causing undesired affects to other blocks of the image sensing device.

In an example aspect of the disclosed technology, an image sensing device may include a semiconductor substrate structured to support a plurality of image pixels producing signals upon a detection of an incident light and a logic circuit configured to process the signals produced by the image pixels are formed, and a noise blocking structure disposed at the semiconductor substrate and formed to surround the logic circuit is located. The noise blocking structure may include a first blocking structure and a second blocking structure. The first blocking structure may include multiple portions spaced from one another, each of the multiple portions extending in a line without any bending portion. The second blocking structure may be disposed between the multiple portions of the first blocking structure and include portions partially overlapping with multiple portions of the first blocking structure.

In another example aspect of the disclosed technology, an image sensing device may include a semiconductor substrate configured to include image pixels producing signals upon a detection of an incident light and at least one logic circuit region processing the signals produced from the image pixels, and a noise blocking structure disposed at the semiconductor substrate. The noise blocking structure may include a first blocking structure discontinuously surrounding the at least one logic circuit region, and a second blocking structure disposed at one or more openings along a boundary of the first block structure overlapping with the first blocking structure.

In another example aspect of the disclosed technology, an image sensing device may include a pixel region provided with a plurality of image pixels producing signals upon a detection of an incident light; and a logic region located outside of the pixel region. The logic region may include a logic circuit configured to process the signals produced by the image pixels, first noise blocking films configured to partly surround the logic circuit, each of first noise blocking films having a deep trench isolation (DTI) structure, and second noise blocking films disposed between the first noise blocking films, each of the second noise blocking films having a shallow trench isolation (STI) structure.

BRIEF DESCRIPTION OF THE DRAWINGS

The above and other features and beneficial aspects of the disclosed technology will become readily apparent with reference to the following detailed description when considered in conjunction with the accompanying drawings.

FIGS. 7*a* to 9*b* are cross-sectional views illustrating methods for forming noise blocking structures shown in FIGS. 4 and 5 according to embodiments of the disclosed technology.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

The image sensing device may include a pixel array with photosensing pixels for capturing images, an analog block for driving the pixel array and reading out signals of the pixel array, and a digital block for processing the signals read out from the analog block. One way to improve image quality is to design the analog block including the pixel array to be less affected by external noises. For example, a high-speed operation is needed for high-definition image sensing devices, which may cause noises. If the noises caused by the high-speed operation is applied to the analog block, the image quality can be negatively affected.

The disclosed technology can be implemented to provide an image sensing device including a noise blocking structure which can prevent noise generated in a logic circuit block from negatively affecting to other parts of the image sensing device.

Figure 1:
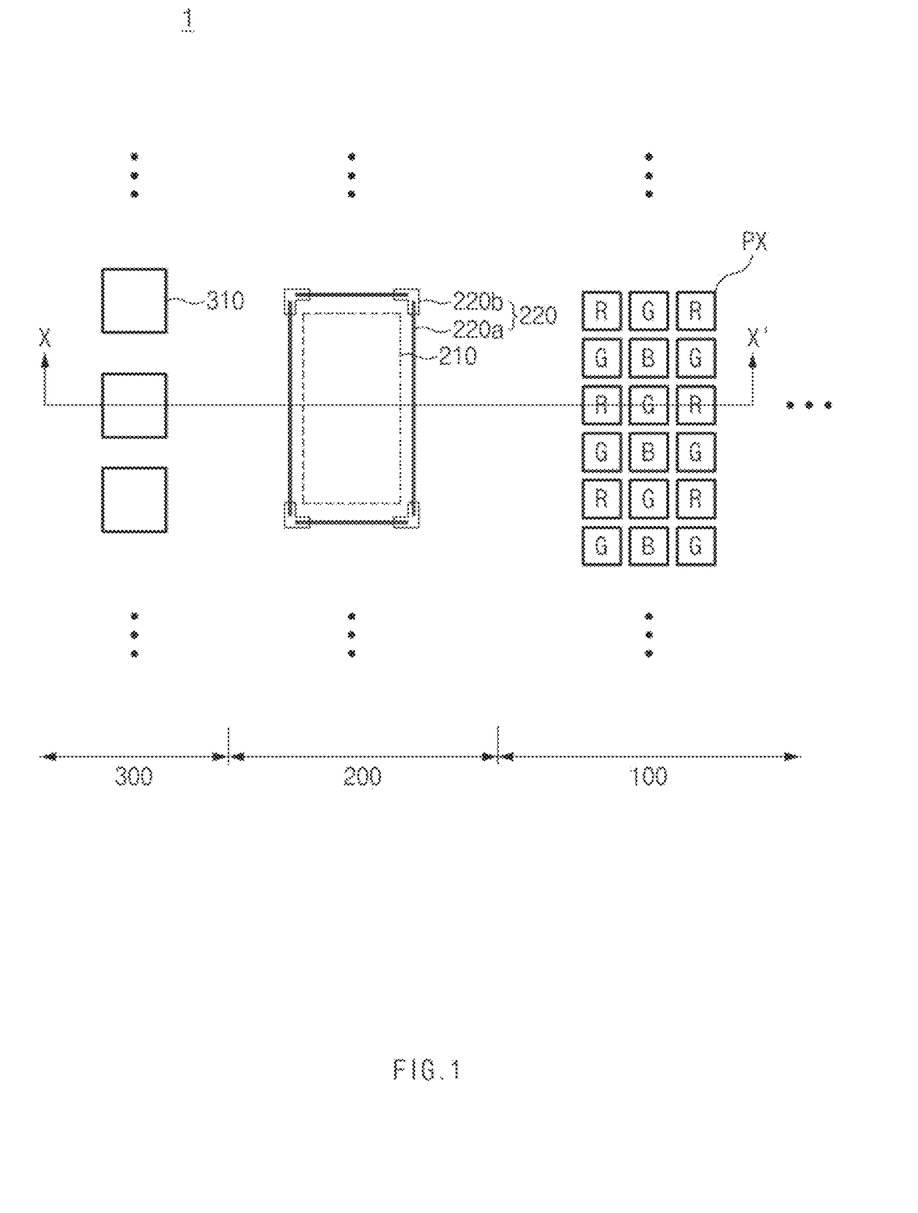
FIG. 1 is an example of a plan view illustrating an image sensing device based on some implementations of the disclosed technology.
Figure 2:
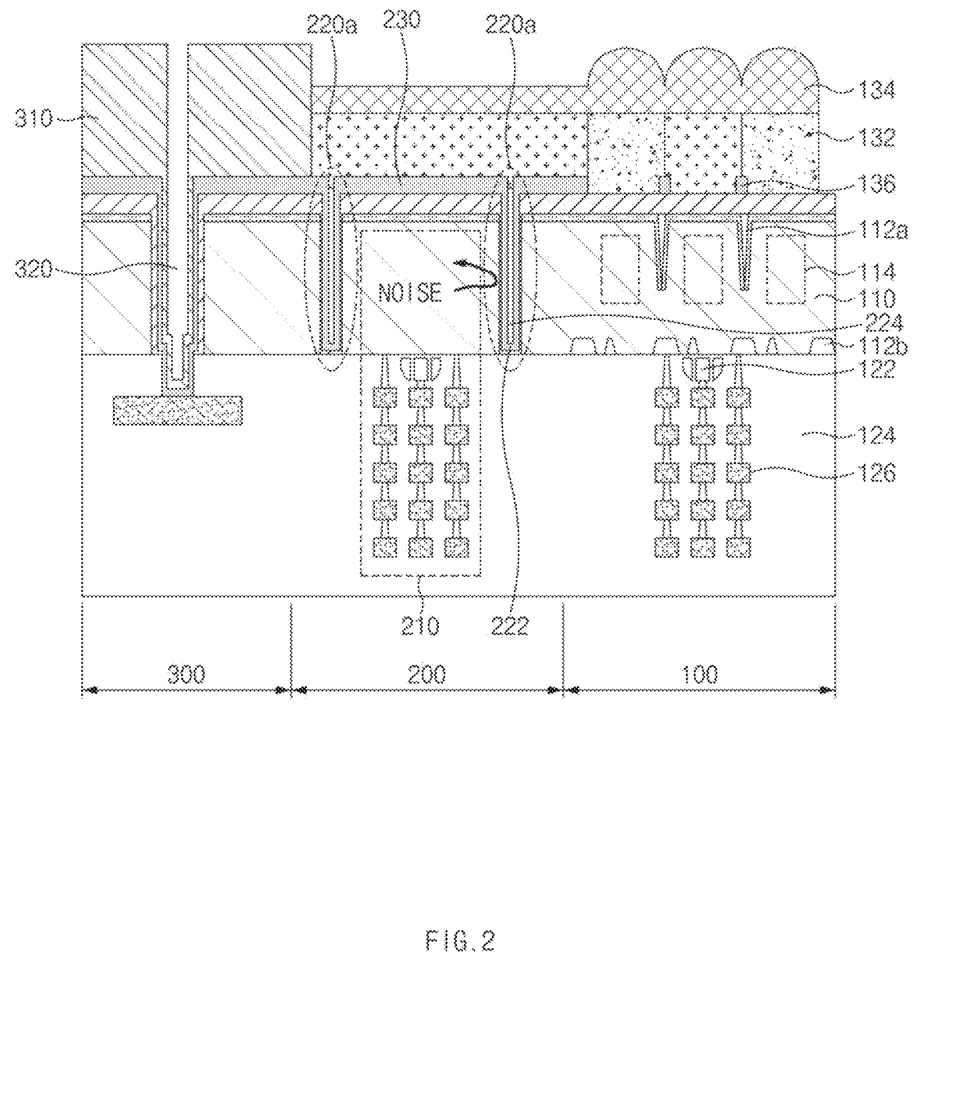
FIG. 2 is a cross-sectional view illustrating the image sensing device taken along the line X-X' shown in FIG. 1.

FIG. 1 is an example of a plan view illustrating an image sensing device according to an embodiment of the disclosed technology. FIG. 2 is a cross-sectional view illustrating the image sensing device taken along the line X-X' shown in FIG. 1.

Referring to FIGS. 1 and 2, the image sensing device 1 may include a pixel region 100, a logic region 200, and a pad region 300.

The pixel region 100 may include a plurality of image pixels (PXs), each of which detects incident light and outputs an electrical signal corresponding to the detected light. The image pixels (PXs) may selectively detect red light (R), green light (G), or blue light (B), and may be arranged in a Bayer pattern.

A plurality of device isolation structures 112a and 112b for defining active regions of unit pixels (PXs) may be formed in a semiconductor substrate 110 of the pixel array 100. In this case, the device isolation structure 112a may define the active regions in which photoelectric conversion regions (e.g., photodiodes) 114 are formed. In some implementations such as the example shown in FIG. 2, the device isolation structure 112a may include a Deep Trench Isolation (DTI) structure to physically separate the contiguous unit pixels (PXs). The device isolation structure 112b may define active regions in which transistors 122 for reading out photoelectric conversion signals in the unit pixels (PXs) are formed. The device isolation structure 112b may include a Shallow Trench Isolation (STI) structure formed in a P-well region of each unit pixel (PX).

A plurality of sensing elements (e.g., pixel transistors) to read out photoelectric conversion signals as well as to control the unit pixels, a plurality of interlayer insulation films 124, and a plurality of metal lines 126 formed in the interlayer insulation films 124 may be formed at a front side of a semiconductor substrate 110 in the pixel region 100. At a back side of the semiconductor substrate 110 in the pixel region 100, a plurality of color filters 132, a plurality of microlenses 134, and a grid structure 136 may be formed. The plurality of color filters 132 may perform filtering of visible light so that only specific-color light R, G, or B from among visible light can pass through color filters of the color filter layer 132. The microlenses 134 may focus incident light received from an external part, and may transmit the focused incident light to the color filter layers 132. The grid structure 136 may be disposed between the color filters 132 so as to prevent occurrence of crosstalk between contiguous unit pixels.

The logic region 200 may be located outside of the pixel region 100, and may include a plurality of logic circuit blocks 210 in which the logic circuits for processing signals read out from the pixel region 100 are formed. In various implementations, the photosensing pixels can be formed in a semiconductor substrate below a front side surface and additional circuitry layers, including layers that are fabricated to form the logic circuit blocks 210, may be further formed over the photosensing pixels at the front side of the semiconductor substrate 110 while the color filters 132 and the microlenses 134 may be formed at the rear side of the semiconductor substrate 100 after thinning the backside of the semiconductor substrate 110. Although the logic region 200 of FIG. 1 includes one logic circuit block 210 for convenience of description, the number of the logic circuit block included in the logic region is not limited to one, and other implementations are also possible.

In the logic region 200 of the semiconductor substrate 110, a noise blocking structure 220 may be formed to prevent noise generated from the logic circuit block 210 from entering the pixel region 100. In some implementations, the noise blocking structure 220 may be formed outside or at an outer wall of the logic circuit block 210 to surround the logic circuit block 210. The noise blocking structure 220 may include a first blocking structure 220a formed to pass through the semiconductor substrate 110, and a second blocking structure 220b formed by the semiconductor substrate 110 etched to a predetermined depth. Thus, in some implementations, the first blocking structure 220a has a through-barrier structure and the second blocking structure 220b has a trench structure.

A through-region of the first blocking structure 220a may be formed simultaneously with etching of the pad region 300 of the semiconductor substrate 110 in a manner that the through-region of the first blocking structure 220a may be etched to pass through the pad region 300 of the semiconductor substrate 110. The first blocking structure 220a may include a metal film 222 and an airgap 224. Although it is described as the metal film 222, it is not limited to the film only and any other structures including a metal can be used. The metal film 222 may be formed of or include a material (e.g., tungsten). In some implementations, the material of the metal film 222 may be identical not only to a material of a shielding metal film 230 shielding the logic region 200 but also to a material of the grid structure 136 of the pixel region 100. In some implementations, the shielding metal film 230 refers to the structure formed at the logic region 200. For example, when a metal film for shielding the logic region 200 is formed, the corresponding metal material may enter the through-region, resulting in the formation of the metal film 222.

In some implementations, in a horizontal plane, the first blocking structure 220a may be formed to extend in a straight line and the first blocking structure 220a may not have any bending portion as shown in FIG. 1. In the example of FIG. 1, the first blocking structure 220a may have multiple portions distanced apart from each other. Some of the multiple portions extend in a first direction in the horizontal plane and some others of the multiple portions extend in a second direction perpendicular to the first direction. In some implementations, in a vertical plane perpendicular to the horizontal plane, the first blocking structure 220a may include a plurality of barrier-shaped noise blocking structures (e.g., films) passing through the semiconductor substrate 110, as shown in FIG. 2. Referring to FIGS. 1 and 2, the first blocking structure 220a may discontinuously surround the logic circuit block 210 and include one or more openings along a boundary of the first blocking structure 220a. In the one or more openings, the first blocking structure 220a is not present.

Assuming a case where a noise blocking film is continuously formed to surround the entire logic circuit block 210 in the horizontal plane, then the noise blocking film has a certain portion in which the noise blocking film is bent around a certain portion (e.g., corner) of the noise blocking film. For example, since the noise blocking structure is formed to surround the logic circuit, the noise blocking structure has portions which extend in different directions and thus there exists a certain portion (e.g., corner) where the extending direction of the noise blocking structure is changed in the horizontal plane. The existence of such a portion (e.g., a corner) makes it difficult to etch the semiconductor substrate 110 and/or form the through-hole in the semiconductor substrate 110 at or around the such portion. Thus, when the noise blocking structure is formed by etching or forming a through-hole in the semiconductor substrate 110, if the noise blocking structure has a bending portion, the noise blocking structure might be formed not as designed and the noise blocking structure might not operate as expected. In order to prevent such undesired situations, the disclosed technology provides the noise blocking structure including the first blocking structure 220a and the second blocking structure 220b. In addition, the first blocking structure 220a may be formed of or include plural noise blocking films, each of which is formed in a line shape where the bent portion is not present in the horizontal plane. The first blocking structure 220a may include the noise blocking films which are formed in a line shape in the horizontal plane (hereinafter referred to as line-shaped noise blocking films for convenience of description), spaced apart from each other by a predetermined distance, and formed to surround the logic circuit block 210. For example, as shown in FIG. 1, the line-shaped noise blocking films may have a belt shape surrounding the logic circuit block 210. The first blocking structure 220a may include openings disposed between adjacent two of the line-shaped noise blocking films, in which no noise blocking film is present. In the example of FIG. 1, the line-shaped noise blocking films are not disposed at the openings between the line-shaped noise blocking films and the openings between the line-shaped noise blocking films are open without the presence of the line-shaped noise blocking film.

In the open portion of the first blocking structure 220a, a second blocking structure 220b may be formed. In some implementations, the second blocking structure 220b may include an insulation film filled or buried in a trench formed by etching the semiconductor substrate 110 to a predetermined depth. The trench for forming the second blocking structure 220b may be formed simultaneously with formation of the device isolation structure 112b disposed in the pixel array 100. The noise blocking structure 220 will be described in more detail later with reference to FIGS. 3-5.

The pad region 300 may include a plurality of pads 310 through which the image sensing device is coupled to an external device. The pads 310 may be coupled to a metal line formed over the front side of the semiconductor substrate 110 through a through-hole 320 passing through the semiconductor substrate 110.

Figure 3:
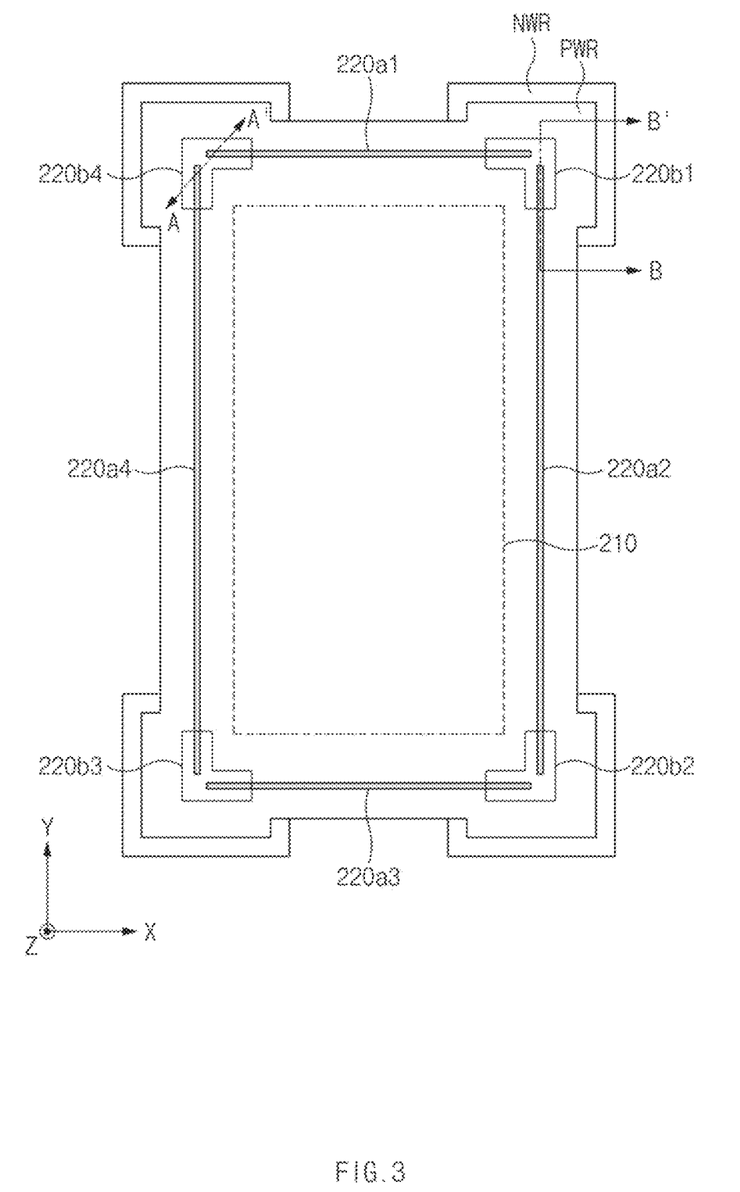
FIG. 3 is an example of a plan view illustrating a noise blocking structure based on some implementations of the disclosed technology.
Figure 4:
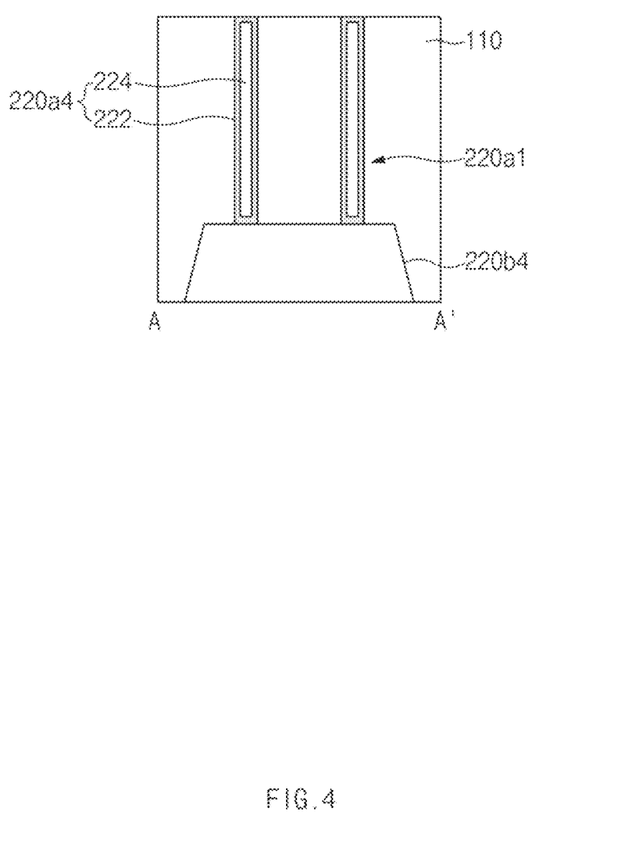
FIG. 4 is a cross-sectional view illustrating the noise blocking structure taken along the line A-A' shown in FIG. 3.
Figure 5:
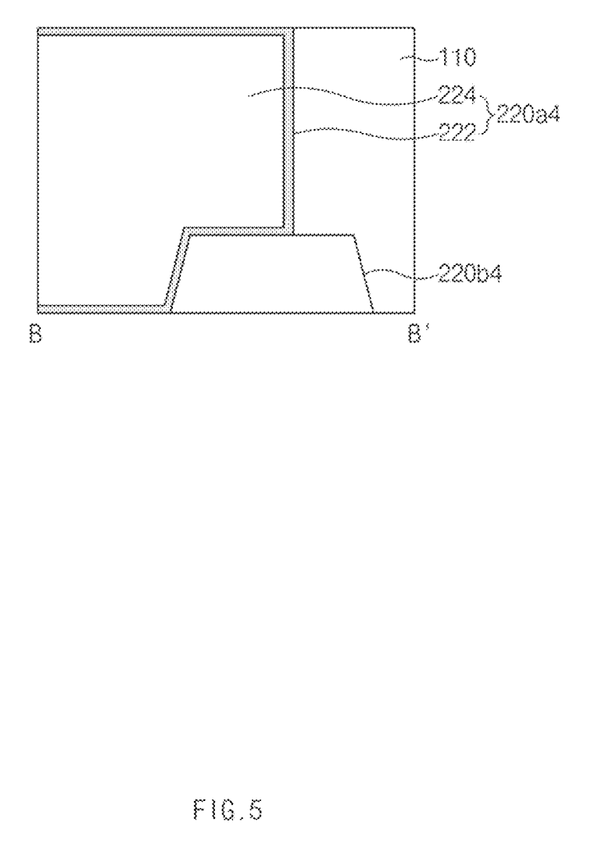
FIG. 5 is a cross-sectional view illustrating the noise blocking structure taken along the line B-B' shown in FIG. 3.

FIG. 3 is an example of a plan view illustrating a noise blocking structure based on some implementations of the disclosed technology. FIG. 4 is a cross-sectional view illustrating the noise blocking structure taken along the line A-A' shown in FIG. 3. FIG. 5 is a cross-sectional view illustrating the noise blocking structure taken along the line B-B' shown in FIG. 3.

Referring to FIGS. 3 to 5, the noise blocking structure based on some implementations of the disclosed technology may include a first blocking structure 220a (including first noise blocking films 220a1 to 220a4) and a second blocking structure 220b (including second noise blocking films 220b1 to 220b4). The first blocking structure 220a and the second blocking structure 220b are not limited to have film structures, other structures can be used to provide the first and second blocking structures 220a and 220b.

The first blocking structure 220a may include a plurality of line-shaped noise blocking films 220a1 to 220a4. Each of the line-shaped noise blocking films 220a1 to 220a4 may include a metal film 222 and an airgap 224.

The first blocking structure 220a may be formed in a manner that the line-shaped noise blocking films 220a1 to 220a4 are spaced apart from each other by a predetermined distance and surround the logic circuit block 210 (e.g., a region including logic circuits in the semiconductor substrate 110). For example, the first blocking structure 220a may include plural line-shaped noise blocking films 220a1 to 220a4 arranged in the semiconductor substrate 110 except certain portions between the line-shaped noise blocking films 220a1 to 220a4. When the first blocking structure 220a has a belt shape surrounding the logic circuit block 210, the certain portions between adjacent two of the line-shaped noise blocking films 220a1 to 220a4 are open without including the first blocking structure 220a, thereby providing openings in the first blocking structure 220a. In some implementations, the noise blocking films 220a1 to 220a4 may be arranged in different directions, e.g., X-axis and Y-axis directions, and the noise blocking films 220a1 to 220a4 may be spaced apart from each other by a predetermined distance without contacting each other.

As described above, the first blocking structure 220a may be formed to include plural line-shaped noise blocking films 220a1 to 220a4 which are spaced apart from each other by a predetermined distance instead of being formed as a continuously extending structure. Thus, the first blocking structure 220a may surround the logic circuit block 210 except the openings between the adjacent two of the plural line-shaped noise blocking films 220a1 to 220a4. By configuring the first blocking structure 220a with the multiple portions and arranging the multiple portions of the first blocking structure 220a at the semiconductor substrate 110 except the openings between the multiple portions, the first blocking structure 220a does not have any bending portion. The noise blocking films 220a1 to 220a4 may be formed to pass through the semiconductor substrate 110 in a Z-axis direction, as shown in FIG. 2. Thus, the noise blocking films 220a1 to 220a4 may be formed in a line shape in a horizontal direction (including, for example, X-axis and Y-axis directions) such that each of the noise blocking films 220a1 to 220a4 does not have any bending portion in the horizontal direction. The noise blocking films 220a1 to 220a4 may be formed in a barrier shape in a vertical direction (i.e., Z-axis direction) such that each of the noise blocking films 220a1 to 220a4 may pass through the semiconductor substrate 110 in the vertical direction.

Figure 6A:
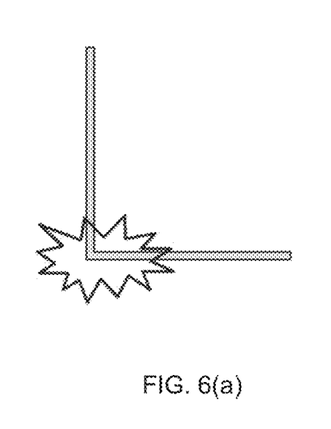
FIGS. 6*a* and 6*b* show examples of defects occurring in a noise blocking film of an image sensing device.
Figure 6B:
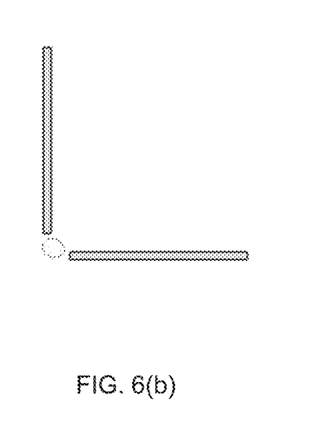
Figure 7:
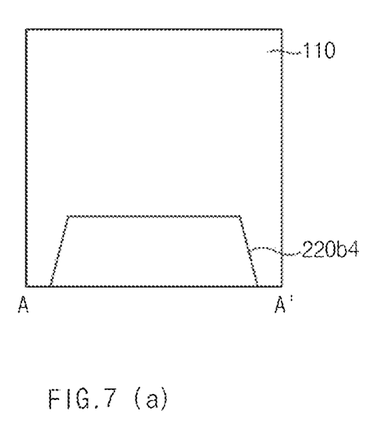
Figure 8:
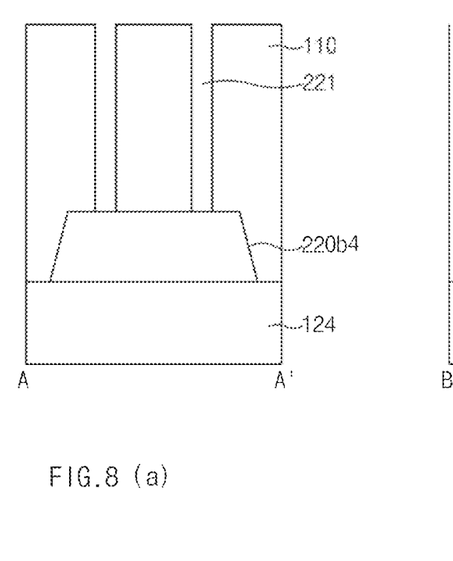
Figure 9:
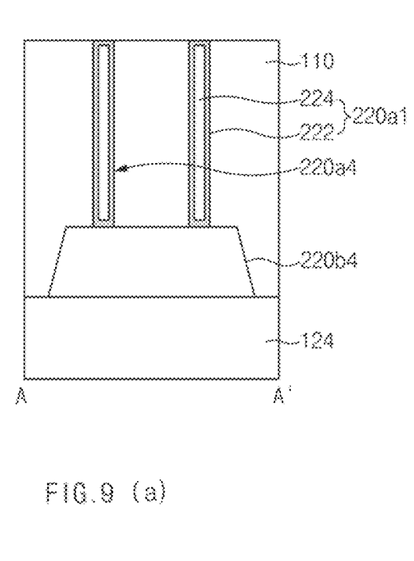

FIG. 6A shows the case that the noise blocking film is formed as an entirely-connected single unit (e.g., film) extending to continuously surround the logic circuit block 210. In this case, the entirely-connected single unit has a bending portion at a certain part of the unit as shown in FIG. 6A. As discussed above, the existence of the bending portion in the noise blocking structure makes it difficult to form the through-hole in the semiconductor substrate at or around such bending portion of the noise blocking structure. Thus, if the noise blocking film is formed to pass through the semiconductor substrate, there is a high possibility that the noise blocking film does not pass through the semiconductor substrate in the bending portion (e.g., the corner) as shown in FIG. 6B. In this case, the noise blocking film is formed not as designed, e.g., not passing through the semiconductor substrate in the opening of the noise blocking film, the noise may leak outside through the opening of the noise blocking film.

Therefore, some implementations of the disclosed technology suggest a design of the first blocking structure 220a to be formed in a manner that the noise blocking films 220a1 to 220a4 surround the logic circuit block 210 except certain portions between the noise blocking films 220a1 to 220a4. In some implementations, the second blocking structure 220b may be formed in the certain portions between the noise blocking films 220a1 to 220a4 to fill the opening formed between the noise blocking films 220a1 to 220a4. If the noise blocking structure 220 includes the first blocking structure 220a only (e.g., the noise blocking films 220a1 to 220a4) without the second blocking structure 220b, the leakage of noise can occur through the certain portions between the noise blocking films 220a1 to 220a4. By including the second blocking structure 220b in the certain portions between the noise blocking films 220a1 to 220a4, it is possible to prevent leakage of noise from the logic circuit block to other parts of the image sensing device.

Although the second blocking structure 220b is shown in the drawings to have a bent shape (e.g., L-shape), other implementations are possible. In some implementations, the second blocking structure 220b may be formed to have a Shallow Trench Isolation (STI) structure.

The second blocking structure 220b may include a plurality of noise blocking elements (e.g., films) 220b1 to 220b4, each of which has a shallow trench isolation (STI) structure. The noise blocking films 220b1 to 220b4 may be formed between the noise blocking films 220a1 to 220a4, such that ends of at least one noise blocking film 220b1, 220b2, 220b3, or 220b4 may overlap with end portions of corresponding two of the noise blocking film 220a1, 220a2, 220a3, or 220a4. Thus, the noise blocking structure 220 may be formed in a closed loop shape in which the noise blocking films 220a1 to 220a4 and the noise blocking films 220b1 to 220b4 are alternately and successively coupled to one another to surround the logic circuit block 210. For example, the noise blocking films 220a1 to 220a4 may have a line shape and the noise blocking films 220b1 to 220b4 may have a STI structure.

The coupling portion between one of the noise blocking films 220a1 to 220a4 of the first blocking structure 220a and one of the noise blocking films 220b1 to 220b4 of the second blocking structure 220b may be formed in a manner that the noise blocking film 220b1, 220b2, 220b3, or 220b4 is formed to overlap with a lower portion of the noise blocking film 220a1, 220a2, 220a3, or 220a4, as shown in FIGS. 4 and 5.

Each of the noise blocking films 220b1 to 220b4 may include a specific structure that is formed by burying an insulation film in a trench formed by etching the front side of the semiconductor substrate 110 to a predetermined depth. The noise blocking films 220b1 to 220b4 may be formed together with the device isolation structure 112b formed in the pixel region 100. Thus, each of the noise blocking films 220b1 to 220b4 may be formed in a same shape as the device isolation structure 112b.

The first blocking structure 220a and the second blocking structure 220b may be formed in a P-well region (PWR) of the semiconductor substrate 110. An N-well region (NWR) may be formed in an outer wall of the P-well region (PWR) provided with the second blocking structure 220b. Thus, the N-well region (NWR) may be formed to surround the outer wall of the P-well region (PWR) provided with the second blocking structure 220b. By the above-mentioned arrangement of the P-well region and the N-well region, noise having positive (+) polarity (hereinafter referred to as positive (+) noise components) may be re-combined in the P-well region (PWR), such that the positive (+) noise components can disappear. Although some of the negative (−) noise components are unavoidably escaped outside the second blocking structure 220b, the escaped negative (−) noise components may be re-combined in the N-well region (NWR), such that the negative (−) noise components may disappear.

Although FIGS. 4 and 5 have disclosed the exemplary cases in which each of the noise blocking films 220a1 to 220a4 includes the metal film 222 and the airgap 224, other implementations are also possible. For example, each of the noise blocking films 220a1 to 220a4 may be formed to include either the metal film 222 or the airgap 224. For example, if the through-hole 221 is formed to have a relatively greater width sufficient to introduce a metal material easily into the through-hole 221, the metal film 222 may be formed to fill the through-hole 221. Alternatively, if the through-hole 221 is formed to have a relatively smaller width and the metal film 222 may not enter the through-hole 221, an upper part of the through-hole 221 is covered (closed) by the metal film 222 and only the airgap 224 may be formed in the through-hole 221.

Although the above-mentioned embodiment has exemplarily disclosed that the first blocking structure 220a is arranged in a manner that the certain portions of the first blocking structure 220a, e.g., edge portions or corners of the square belt shape of the first blocking structure 220a, are open, other implementations are also possible. Thus, the first blocking structure 220a may be arranged in various ways according to arrangement formats of the logic circuit block. For example, the first blocking structure 220a may be arranged in a manner that the edge portion of the polygonal belt shape of the first blocking structure 220a is removed.

FIGS. 7a to 9b are examples of cross-sectional views illustrating methods for forming a noise blocking structures shown in FIGS. 4 and 5 based on some implementations of the disclosed technology.

Referring to FIGS. 7a and 7b, the semiconductor substrate 110 located at a region to be used as a formation region of the noise blocking films 220b1 to 220b4 in the logic region 200 may be etched to a predetermined depth, resulting in formation of a trench. For example, the formation region of the noise blocking films 220b1 to 220b4 shown in FIG. 3 may be etched to a predetermined depth, resulting in formation of a trench. In this case, the trench may be formed in a P-well region in which logic circuits are formed at the front side of the semiconductor substrate 110.

Subsequently, after the insulation film is formed to fill the trench, the insulation film may be planarized such that the noise blocking films 220b1 to 220b4 may be formed. Although only one noise blocking film 220b4 is shown in FIGS. 7a and b for convenience of description, the noise blocking films 220b1 to 220b4 of the second blocking structure 220b may be simultaneously formed.

The noise blocking films 220b1 to 220b4 may be formed together with the device isolation structures 112b formed in the pixel region 100. For example, each of the noise blocking films 220b1 to 220b4 may include a Shallow Trench Isolation (STI) structure.

Referring to FIGS. 8a and 8b, in the upper portion of the semiconductor substrate 110 in which the noise blocking films 220b1 to 220b4 are formed, logic circuits may be formed in the logic circuit block 210, and at least one interlayer insulation film 124 and at least one metal line may be formed over the logic circuits.

Thereafter, the semiconductor substrate 110 of the region to be used as a formation region of the noise blocking films 220a1 to 220a4 at the front side of the semiconductor substrate 110 may be etched to pass therethrough, resulting in formation of the through-holes 221. For example, the semiconductor substrate 110 of the region to be used as a formation region of the noise blocking films 220a1 to 220a4 shown in FIG. 3 may be etched to pass therethrough, resulting in formation of the through-holes 221.

The through-holes 221 may be formed together with the through-hole 320 formed in the pad region 300 shown in FIG. 2.

Referring to FIGS. 9a and 9b, the metal film 222 may be formed in each of the through-holes 221, resulting in formation of the noise blocking films 220a1 to 220a4. In this case, the noise blocking films 220a1 to 220a4 may be configured in a manner that the metal films 222 may be formed in the through-holes 221. In some implementations, the noise blocking films 220a1 to 220a4 may be formed on side, bottom, and top surfaces of the through-holes 221 and the airgap 224 may be formed in spaces surrounded by the noise blocking films 220a1 to 220a4. Each of the metal films 222 may include tungsten (W).

Each of the metal films 222 may be formed simultaneously with formation of the shielding metal film for shielding the logic region 200. For example, the metal film 222 may be formed when a metal material corresponding to the shielding metal film is introduced or inserted into the through-holes 221.

Although FIGS. 9a and 9b show that the metal films 222 are formed in the through-holes 221, other implementations are also possible. For example, the metal films 222 may also be formed to be fully buried in the through-holes 221. For example, if each of the through-holes 221 is formed to have a relatively greater width sufficient to introduce the metal material easily into the through-holes 221, the metal films 222 may be formed to fill the through-holes 221. Alternatively, if the through-hole 221 is formed to have a relatively smaller width and the metal films 222 may not enter the through-holes 221, an upper parts of the through-holes 221 are closed by the metal films 222, such that only the airgap 224 may be formed in each of the through-holes 221.

As is apparent from the above description, the image sensing device according to the embodiments of the disclosed technology may effectively prevent noise generated from a logic circuit block from leaking outside. Thus, the analog block of the image sensing device can be prevented from being affected by the generated noise, and characteristics of the image sensing device can be improved.

Although a number of illustrative embodiments have been described, it should be understood that numerous other modifications and embodiments can be devised by those skilled in the art that will be made.

What is claimed is:

1. An image sensing device comprising:
a semiconductor substrate structured to support a plurality of image pixels producing signals upon a detection of an incident light and a logic circuit configured to process the signals produced by the image pixels; and
a noise blocking structure disposed at the semiconductor substrate, and formed to surround the logic circuit,
wherein the noise blocking structure includes:
a first blocking structure including first multiple portions spaced from one another, each of the first multiple portions extending in a line without any bending portion, and
a second blocking structure disposed between the first multiple portions of the first blocking structure and including portions partially overlapping with the first multiple portions of the first blocking structure.

2. The image sensing device according to claim 1, wherein the second blocking structure includes an insulation material buried in a trench formed in the semiconductor substrate.

3. The image sensing device according to claim 1, wherein the second blocking structure has an L-shape.

4. The image sensing device according to claim 1, wherein the first multiple portions of the first blocking structure are arranged to form a polygonal belt shape including opening in which the first blocking structure is not present.

5. The image sensing device according to claim 1, wherein the first blocking structure includes a metal material and an airgap.

6. The image sensing device according to claim 1, wherein the first blocking structure and the second blocking structure are formed in a P-well region of the semiconductor substrate.

7. The image sensing device according to claim 6, further comprising:
an N-well region formed to surround an outer wall of the P-well region.

8. The image sensing device according to claim 1, wherein the second blocking structure includes second multiple portions, each second multiple portion formed between two adjacent of the first multiple portions of the first blocking structure and one of the second multiple portions of the first blocking structure and one of the multiple portions of the second blocking structure are alternately coupled to each other.

9. The image sensing device according to claim 1, wherein the logic circuit is formed in a lower portion of the semiconductor substrate.

10. An image sensing device comprising:
a semiconductor substrate configured to include image pixels producing signals upon a detection of an incident light and at least one logic circuit region processing the signals produced from the image pixels; and
a noise blocking structure disposed at the semiconductor substrate,
wherein the noise blocking structure includes:
a first blocking structure discontinuously surrounding the at least one logic circuit region,
one or more openings disposed along a boundary of the first blocking structure, and
a second blocking structure disposed at the one or more openings and overlapping with the first blocking structure.

11. The image sensing device according to claim 10, wherein the second blocking structure includes an insulation material buried in a trench formed in the semiconductor substrate.

12. The image sensing device according to claim 10, wherein the first blocking structure has a barrier shape or the second blocking structure has an L-shape.

13. The image sensing device according to claim 10, wherein the first blocking structure includes at least two discrete portions that extend in different directions from each other.

14. The image sensing device according to claim 10, wherein the first blocking structure includes a metal material and an airgap.

15. The image sensing device according to claim 10, wherein the second blocking structure includes multiple portions that are disposed at the one or more openings, respectively.

16. The image sensing device according to claim 10, wherein the first blocking structure and the second blocking structure are formed in a P-well region of the semiconductor substrate.

17. The image sensing device according to claim 16, further comprising:
an N-well region formed to surround an outer wall of the P-well region.

18. The image sensing device according to claim 10, wherein the at least one logic circuit region is formed in a lower portion of the semiconductor substrate.

19. An image sensing device comprising:
a pixel region provided with a plurality of image pixels producing signals upon a detection of an incident light; and
a logic region located outside of the pixel region and including:
a logic circuit configured to process the signals produced by the plurality of image pixels,
first noise blocking films configured to partly surround the logic circuit, each of the first noise blocking films having a deep trench isolation (DTI) structure, and
second noise blocking films disposed between the first noise blocking films, each of the second noise blocking films having a shallow trench isolation (STI) structure.

20. The image sensing device according to claim 19, wherein each of the first noise blocking films is formed to extend in a straight line having no bending portion.

21. The image sensing device according to claim 19, wherein the second noise blocking films have an L-shape.

22. The image sensing device according to claim 19, wherein the second noise blocking films have a portion overlapping with the first noise blocking films.

23. The image sensing device according to claim 19, wherein the logic region is disposed in a lower portion of a semiconductor substrate.

* * * * *